(12) United States Patent
Shi et al.

(10) Patent No.: US 6,284,050 B1
(45) Date of Patent: Sep. 4, 2001

(54) UV EXPOSURE FOR IMPROVING PROPERTIES AND ADHESION OF DIELECTRIC POLYMER FILMS FORMED BY CHEMICAL VAPOR DEPOSITION

(75) Inventors: Jianou Shi, Milpitas; James C. Mitchener, Danville, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/080,905

(22) Filed: May 18, 1998

(51) Int. Cl.[7] .................................................. C23C 16/00
(52) U.S. Cl. ........................... 118/715; 118/720; 427/509; 427/520; 427/521; 427/522; 427/558; 427/585; 438/758; 438/761
(58) Field of Search ..................................... 427/509, 520, 427/521, 522, 558, 585; 118/715, 720; 438/758, 761

(56) References Cited

U.S. PATENT DOCUMENTS

| | | | |
|---|---|---|---|
| 4,548,688 | 10/1985 | Matthews | 204/159 |
| 4,880,493 | * 11/1989 | Ashby | 156/628 |
| 5,122,440 | 6/1992 | Chien | 430/315 |
| 5,538,758 | * 7/1996 | Beach | 428/255.6 |
| 5,711,987 | * 1/1998 | Bearinger | 427/7 |
| 5,846,375 | * 12/1998 | Gilchrist | 156/345 |
| 5,869,327 | * 1/1999 | Thakur | 118/50.1 |

* cited by examiner

Primary Examiner—Nasser Ahmad
(74) Attorney, Agent, or Firm—Skjerven Morrill MacPherson LLP; Roberta P. Saxon

(57) ABSTRACT

An ultraviolet-assisted chemical vapor deposition system for improving the adhesion, hardness, and thermal stability of organic polymer films deposited on semiconductor wafers is provided. The system includes an ultraviolet lamp and a tube-shaped monomer distribution system positioned over the wafer allowing ultraviolet irradiation of the wafer before, during and/or after deposition. Processes for depositing organic polymer films on semiconductor wafers are also provided. The processes include one or more depositions, one or more ultraviolet exposures, and one or more anneals.

23 Claims, 2 Drawing Sheets

UV EXPOSURE FOR IMPROVING PROPERTIES AND ADHESION OF DIELECTRIC POLYMER FILMS FORMED BY CHEMICAL VAPOR DEPOSITION

BACKGROUND OF THE INVENTION

1. Field of the Invention

This invention relates to deposition of films on a substrate by chemical vapor deposition and more particularly to deposition of films with improved properties by including exposure to ultraviolet light in the deposition process.

2. Description of Related Art

Advanced semiconductor devices having higher performance and greater functionality than previous devices are often characterized by decreasing device feature geometries. As device geometries become smaller, the dielectric constant of an insulating material used between conducting paths becomes an increasingly important factor in device performance. Reducing this value advantageously lowers power consumption, reduces crosstalk, and shortens signal delay for closely spaced conductors.

Organic polymers are advantageously used to provide insulating films for low dielectric constant applications. Many of these films are typically applied by chemical vapor deposition, a process that is widely used in the semiconductor industry. The dielectric constants of organic polymer films are typically between 1.5 and 3, considerably lower than the dielectric constant of approximately 4 of a silicon oxide ($SiO_2$) film, the material often employed as an insulating material in conventional devices. However, while $SiO_2$ adheres easily to the silicon, silicon-containing, or metal surfaces of typical semiconductor devices, organic polymer films do not generally adhere as well to these semiconductor substrates. In addition, organic polymer films often do not exhibit the hardness and thermal stability desired of films used as insulating layers in semiconductor devices.

It is known that exposing organic polymer films to ultraviolet (UV) radiation promotes cross-linking of polymers in the films, a process which is associated with increased hardness, improved thermal stability, improved film cohesion, and reduced subsequent outgassing of the films. For example, the improved thermal and mechanical stability obtained by cross-linking fluorocarbon polymer chains is described in R. A. Flinn et al. in "Engineering Materials and Their Applications," pp 370, 409 ($2^{nd}$ Ed., 1981). It is also known that simultaneous irradiation of organic materials during polymerization is often advantageous for promoting the completion of polymerization.

However, as stated previously, many low dielectric constant films are typically applied to semiconductor wafers in chemical vapor deposition (CVD) processes and conventional CVD systems are not designed to accommodate a light source directed at the wafer surface.

Thus, it would be desirable to provide a process to improve the hardness, thermal stability, and adhesion properties of low dielectric constant organic films. It would be desirable to improve these properties by cross-linking the polymer films by exposure to UV radiation. It would also be desirable to promote completion of polymerization during deposition by exposure to UV radiation. It would further be desirable to provide a CVD apparatus for the deposition of such films that includes a means to expose wafer surfaces to UV radiation.

SUMMARY OF THE INVENTION

The present invention is directed to a chemical vapor deposition (CVD) system for the deposition of polymer films on a semiconductor wafer which provides for exposure of the wafer surface to ultraviolet (UV) radiation before, during, and/or after the deposition process.

In one embodiment, the present invention is an ultraviolet-assisted chemical vapor deposition system, a CVD system that incorporates a UV light source. The CVD system includes a deposition chamber, a chuck disposed on a pedestal for supporting a semiconductor wafer, and a UV lamp positioned above the chamber, and directed toward the semiconductor wafer, so as to uniformly illuminate the wafer surface.

In one embodiment, the invention includes a tube-shaped monomer manifold for supplying the film precursor, disposed within the deposition chamber, above the semiconductor wafer. The central opening of the tube-shaped distribution system is aligned to allow light from the UV lamp to uniformly cover the wafer surface. In another embodiment, the CVD system of the present invention includes an optical window made of a suitable material that transmits ultraviolet light, such as quartz or sapphire, installed at the top of the deposition chamber, above the monomer distribution system, allowing light from the UV lamp to enter the chamber.

In further embodiments, the present invention includes processes for improving the properties of polymer films applied to semiconductor wafers in CVD processes by exposing them to UV radiation. The processes include one or more depositions, one or more UV exposures, and one or more anneals. In one embodiment, the process is a post-deposition process in which a polymer film on a wafer is irradiated after deposition is completed. In this case, the order of the process is: deposition, UV treatment, anneal. Alternatively, the UV exposure and anneal can be reversed so that the order of the process is: deposition, anneal, UV treatment, followed by an optional second anneal.

In another embodiment, the process has two depositions. According to one version of the multi-deposition process, first, a thin layer of film is deposited on a wafer surface. Second, the thin layer is exposed to UV radiation. Third, additional polymer is deposited on the UV-treated film until a desired thickness is achieved. According to a second version, the second deposition is followed by a second UV treatment. In both versions, the process also includes a final anneal.

The invention also includes an in situ UV-assisted deposition process in which the wafer surface is exposed during deposition. The deposition followed by UV treatment, at the start of the multi-deposition processes, could alternatively be replaced by an in situ UV-assisted deposition. In another embodiment, a UV-pre-cleaning process is provided in which a wafer surface is exposed to UV irradiation before deposition begins. Any of the post-deposition or multi-deposition processes presented above can be preceded by UV-pre-cleaning. Finally, a UV-assisted annealing procedure is provided in which the wafer is exposed to UV radiation during annealing. In either the post-deposition or multi-deposition processes, in versions when the UV exposure is followed by the final anneal, this part of the process can be replaced by a single UV-assisted anneal.

BRIEF DESCRIPTION OF THE DRAWINGS

The features, aspects, and advantages of the present invention will become better understood with regard to the following description, appended claims, and accompanying drawings where:

Figure 1:
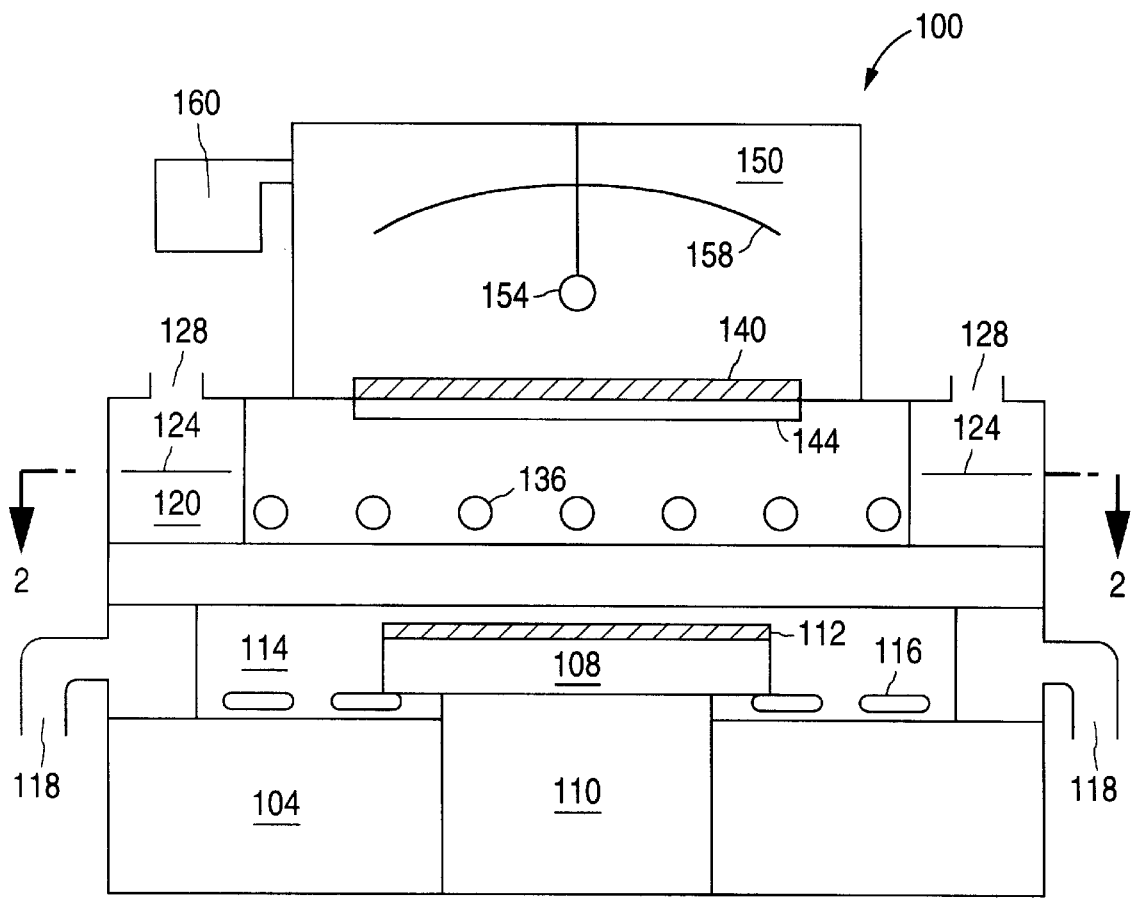
FIG. 1 illustrates a cross-sectional view of an ultraviolet-assisted chemical vapor deposition system.

Reference numerals referring to the same feature appearing in multiple figures are the same.

DETAILED DESCRIPTION

The description of the invention is intended to be illustrative only and not limiting.

Referring to FIG. 1, an illustrative ultraviolet assisted chemical vapor deposition (CVD) system 100 for applying polymer films to semiconductor wafers is shown. Advantageously, the deposition system 100 allows ultraviolet (UV) light to uniformly and controllably illuminate the surface of a semiconductor wafer before, during, and/or after deposition.

FIG. 1 presents a side cross-sectional view of a CVD system 100. The CVD system 100 includes a cylindrical deposition chamber 104 containing a low temperature electrostatic chuck 108 supported on a pedestal 110. A semiconductor wafer 112 is supported on the electrostatic chuck 108. The deposition chamber 104 further includes a tube-shaped exhaust pump manifold 114 encircling the wafer 112. The exhaust pump manifold 114 has a plurality of exhaust pump inlet openings 116 spaced around the bottom edge of the manifold. Advantageously the exhaust pump inlet openings 116 are as close to the level of wafer 112 as possible without interfering with the wafer transfer system for introducing the wafer into the chamber (not shown). The exhaust pump manifold 114 has several exhaust pump outlet lines 118, spaced evenly around the chamber, and communicating through the chamber wall. Advantageously, the exhaust pump manifold 114 has 2, 4, or 6 exhaust pump outlet lines 118.

As shown in FIG. 1, the deposition chamber 104 further includes a tube-shaped manifold 120 for introducing monomer precursor of the polymer film being deposited, located directly above wafer 112 and centered around the wafer. The monomer precursor is introduced in gaseous form into the top side of the monomer manifold 120 through monomer inlet lines 128, evenly spaced around the chamber. Typically, two or four monomer inlet lines 128 are used.

Figure 2:
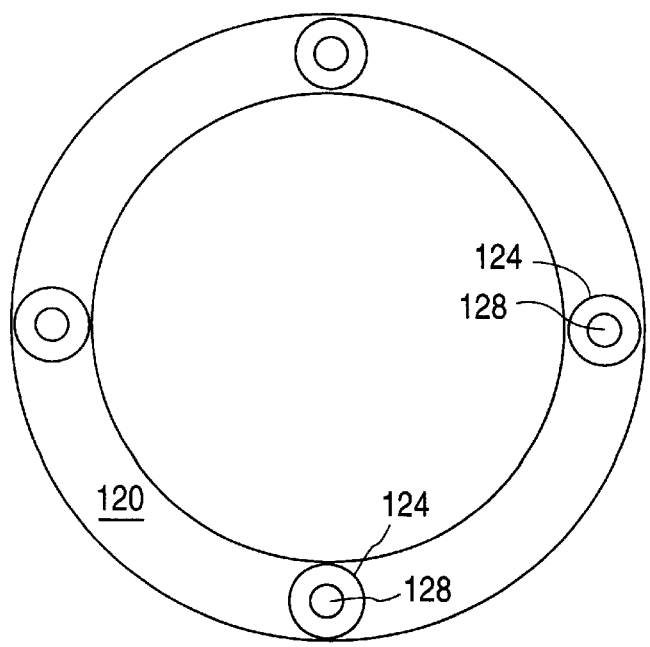
FIG. 2 illustrates a cross-sectional view of the deposition system taken at section 2—2 shown in FIG. 1.

Both exhaust pump manifold 114 and monomer manifold 120 have an annular shape and are concentric with the central axis of wafer 112. A plurality of monomer outlet holes 136 is located around the inner surface of the monomer manifold 120. The inner diameter of the monomer manifold 120 is selected so that monomer is introduced at the outer edge or outside of the outer edge of the wafer 112. For processing an 8-inch semiconductor wafer, the inner diameter of the tube-shaped monomer manifold 120 is preferably between 8 and 12 inches. For processing a 12-inch semiconductor wafer, the inner diameter of the monomer manifold 120 is preferably between 12 and 16 inches. Optionally, the diameter of the monomer outlet holes 136 varies, being larger for the holes furthest away from the monomer inlet lines 128. Referring to FIGS. 1 and 2, monomer baffle plates 124 are disposed inside the monomer manifold 120, under the monomer input lines 128, to prevent direct flow of monomer from the monomer input lines 128 to the monomer outlet holes 136. As shown in FIG. 1, the inner diameter of the exhaust pump manifold 114 is larger than the inner diameter of the monomer manifold 120 to pump away excess monomer from the side of the wafer and from below the wafer plate, for better monomer condensation.

FIG. 1 additionally illustrates an optical window 140 that transmits ultraviolet light. The window 140 is interposed between the deposition chamber 104 and the lamp chamber 150. Preferably the window 140 is made of quartz, for example the GE124 window, or of sapphire. An ultraviolet lamp 154 is mounted in the lamp chamber 150 above the window 140, centered above the wafer 112. The UV lamp emits high intensity light in the wavelength range between 200 and 450 nm, and typically in the range between 230 and 350 nm. The maximum UV radiance on the wafer surface is preferably from 0.5 to 1 $W/cm^2$ and the non-uniformity of UV radiance is preferably less than 5%. Suitable UV lamps include high-pressure mercury-based arc lamps, high-pressure mercury-based electrodeless microwave or radio frequency lamps, high-pressure xenon arc lamps, and narrow gas barrier discharge lamps.

In operation, the window 140 is kept at an elevated temperature to prevent condensation of organic polymer film on the window. In some embodiments, the window 140 is heated by the UV lamp 154. Alternatively, a separate heater (not shown) is installed adjacent the window 140.

An ultraviolet reflector 158 is mounted above the ultraviolet lamp. The UV lamp 154 shown in FIG. 1 has spherical symmetry. The UV reflector 158 is substantially parabaloidal in shape so as to uniformly illuminate the circular semiconductor wafer 112. It will be appreciated that variations of the lamp and reflector geometries described above are possible. For example, the UV lamp 154 can be a linear array. In that case, the ultraviolet reflector 158 consists of multiple components, each component located over one lamp in the linear array so as to uniformly illuminate the circular wafer. Each component of the reflector is a segment of a parabolic cylinder.

A lamp power supply 160 is located outside the UV lamp and connected electrically thereto. In some embodiments, an optical shutter 144 is mounted directly below the window 140 to control the exposure of the wafer surface to UV light without turning the lamp on and off. Preferably the response time of the optical shutter is less than 2 seconds. In alternative embodiments, the lamp power supply 160 is a programmable continuous power controller which turns the lamp on and off with response times less than 2 seconds.

In certain embodiments of the present invention, UV-assisted CVD processes for improving properties of polymer films applied to semiconductor wafers are provided. In these processes, organic polymeric films, applied to semiconductor surfaces by chemical vapor deposition are exposed to ultraviolet radiation before, during and/or after the deposition process. The processes are used advantageously to improve the adhesion of polymer films, such as films of poly(tetrafluoro-p-xylylenes), known as Parylene AF4, to silicon surfaces. Other examples of organic polymers used to form low dielectric constant films on semiconductor wafers include other members of the class of poly (p-xylylenes), known as parylenes, particularly fluorinated poly(p-xylylenes). Additional examples include the parylenes, Parylene N, Parylene C, and Parylene D; Polynaphthalene-N and Polynaphthalene-F; polytetrafluoroethylene, or Teflon; and various fluorocarbons for thermal CVD applications.

In one embodiment, the process is a post-deposition UV treatment. For example, a Parylene film, of typical thickness 1 μm, is deposited on a bare silicon substrate of a semiconductor wafer in a conventional CVD chamber. Alternatively, the wafer surface is silicon oxide, silicon nitride, titanium nitride, or other typical semiconductor substrates. After deposition, the wafer is transferred to another chamber equipped with a UV lamp and exposed for from 10 to 500 seconds, typically from 10 to 90 seconds, at between 100 and 600 mW/cm$^2$ in the wavelength band between 200 and 450 nm. The wafer temperature is between −50° C. and 450° C. during UV treatment. The UV exposure is carried out in an atmosphere of $N_2$, $O_2$, $H_2$, $CF_4$, $NF_3$, $NH_3$, Ar, Kr, or He, or in combinations thereof at a pressure of from several Torr to slightly above atmospheric pressure. Alternatively, the UV exposure is carried out in vacuum. After UV exposure, the wafer is annealed at between 250° C. and 450° C. in an atmosphere as described above or in vacuum.

In another embodiment, the process for improving the properties of organic polymer films has multiple depositions. First a thin layer of organic polymer film is deposited on a semiconductor wafer surface. For example, a from 0.05 μm to 0.50 μm thick film of Parylene material is deposited by a CVD process. Then the deposited layer is exposed to UV radiation. For example, the 0.05–0.50 μm thick Parylene film is exposed for from 5 to 300 seconds, typically 60 seconds at between 100 and 600 mW/cm$^2$. Immediately after exposure, additional organic polymer is deposited on the UV-treated film without additional UV exposure until a desired thickness, for example between 0.7 μm and 2 μm, is achieved. In one version of the multi-deposition process, the second deposition is followed immediately by an anneal.

In a second version, the second deposition is followed by a second UV treatment, of from 10 seconds to 300 seconds at between 100 and 600 mW/cm$^2$. In certain embodiments, all of the foregoing process is performed in the UV-assisted CVD apparatus described above. In alternative embodiments, the thin film is deposited in a multi-chambered conventional CVD apparatus, and the wafer is transferred to a second chamber equipped with a UV lamp, for exposure to UV radiation. After exposure, the wafer is returned to the first chamber for deposition of additional thickness of material. When the UV exposure is performed in the deposition chamber, the wafer temperature is between −50° C. and 0° C. during exposure. When the UV exposure is carried out in a separate chamber, the wafer temperature is between −50° C. and 450° C. during exposure. Finally, the wafer is annealed at between 250 and 450° C. in an atmosphere as described above for the post-deposition process. Alternatively, the wafer is annealed in vacuum.

The invention also includes an in situ UV-assisted deposition process, in which the wafer is exposed in situ during deposition. The UV lamp illuminating the wafer surface is turned on at the same time the deposition process begins. Irradiation can be provided during the entire deposition process or only during deposition of the first 0.05 to 0.5 μm of the film. The exposure is either carried out continuously during deposition or periods of exposure are alternated with periods during which the UV lamp is turned off. For example, a from 10 to 30 second period of exposure may alternate with a from 10 to 30 second period without exposure. The deposition followed by UV treatment at the start of the multi-deposition process, could alternatively be replaced by an in situ UV-assisted deposition. UV exposure occurring at the time of deposition promotes cross-linking of the polymer at the interface between the polymeric film and the substrate, promoting adhesion of the polymer to the substrate. In certain embodiments, UV exposure is begun a few seconds after the start of the deposition process. Delayed UV exposure allows polymerization initiation and first phase polymerization propagation before cross-linking is started.

In addition, an ultraviolet pre-cleaning process is also provided. In this process, the wafer surface is exposed to UV radiation for from 10 to 120 seconds before the start of deposition. Typical UV irradiance is between 100 and 600 mW/cm$^2$ in the wavelength band between 200 and 450 nm. Pre-deposition UV exposure energizes and cleans the substrate surface. Any of the post-deposition treatment or multi-deposition processes described above can be preceded by UV pre-cleaning.

Finally, a UV-assisted annealing procedure is provided in which the wafer is exposed to UV radiation during thermal annealing. For the UV-assisted annealing process, the wafer is supported on a temperature controlled heated chuck in a chamber separate from the deposition chamber. The annealing chamber is a separate chamber in a multi-chambered CVD apparatus or is a completely separate unit. Annealing is conducted in an atmosphere as described above for the post-deposition process. In either the post-deposition or multi-deposition processes, in versions when UV exposure is followed by the final anneal, this part of the process can be replaced by a single UV-assisted anneal.

It will be appreciated that post-deposition UV treatment is also advantageously used to improve the adhesion, film cohesion, hardness, and thermal stability of polymer films applied by spin-on and spray-on processes. For example, spin-on polymers include polyimides, fluorinated polyimides, poly(arylene ethers), fluorinated poly(arylene ethers) benzocyclobutene, fluorinated benzocyclobutene, and polycyclonorbornenes. Spin-on glass materials such as hydrogen silsesquioxane and organo silsesquioxanes are also advantageously treated by UV exposure. Post-deposition UV exposure of nanofoam polymers or aerogels, porous polyimides, and nanoporous silica aerogels is also within the scope of the present invention.

The advantages of embodiments of the present invention will be further described and understood by reference to the following working examples. These examples are provided to illustrate the present invention and do not provide limits or restrictions thereto.

The strength of adhesion between an organic polymer film and a silicon surface is proportional to the transmitted UV energy at the interface between the polymer film and the silicon surface, as demonstrated below in Example 1.

EXAMPLE 1

Layers of Parylene AF4, with thicknesses 0.3, 0.8, and 1.0 μm were deposited on the bare silicon surface of 30 standard 8-inch wafers in a research laboratory chemical vapor deposition apparatus. The coated wafers were transferred to a UV chamber in a nitrogen atmosphere at 14 psi and exposed to 300 mW/cm$^2$ of UV light having a wavelength between 230 and 350 nm for 90 seconds from a mercury-based high pressure lamp. The wafers were annealed at 400° C. for 1 hour in a nitrogen atmosphere. The thickness of the film on each sample was determined by a Tencor Prometrix Spectramap Model AutoSM300.

Figure 3:
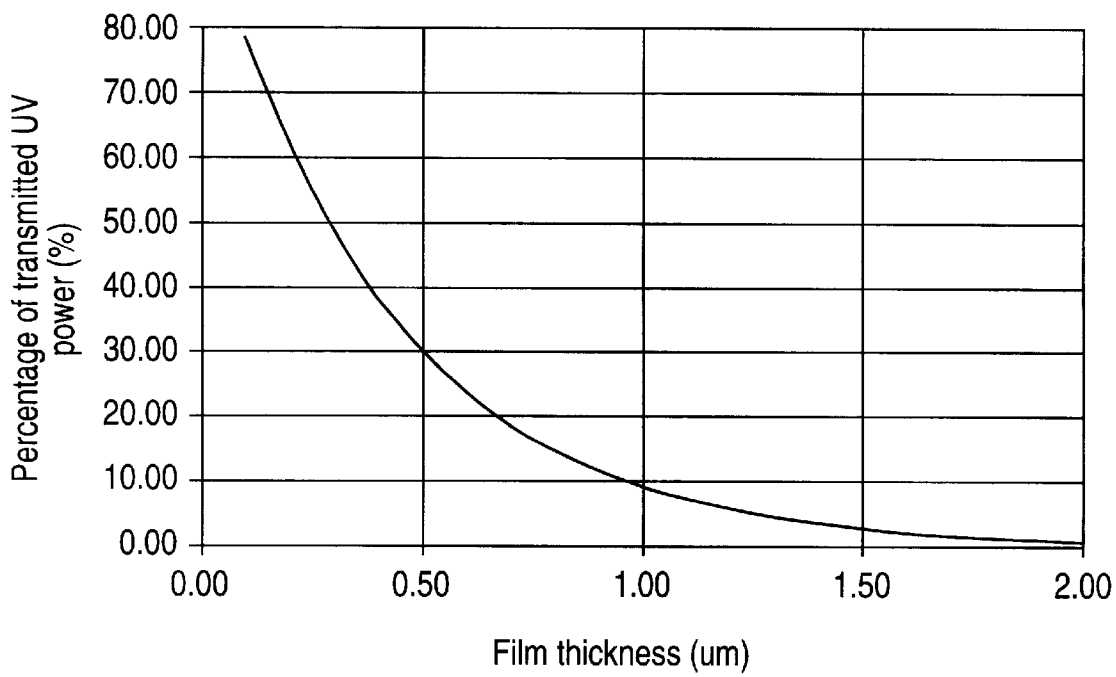
FIG. 3 is a graph showing the measured percentage of transmitted ultraviolet energy versus film thickness for Parylene AF4 films.
Figure 4:
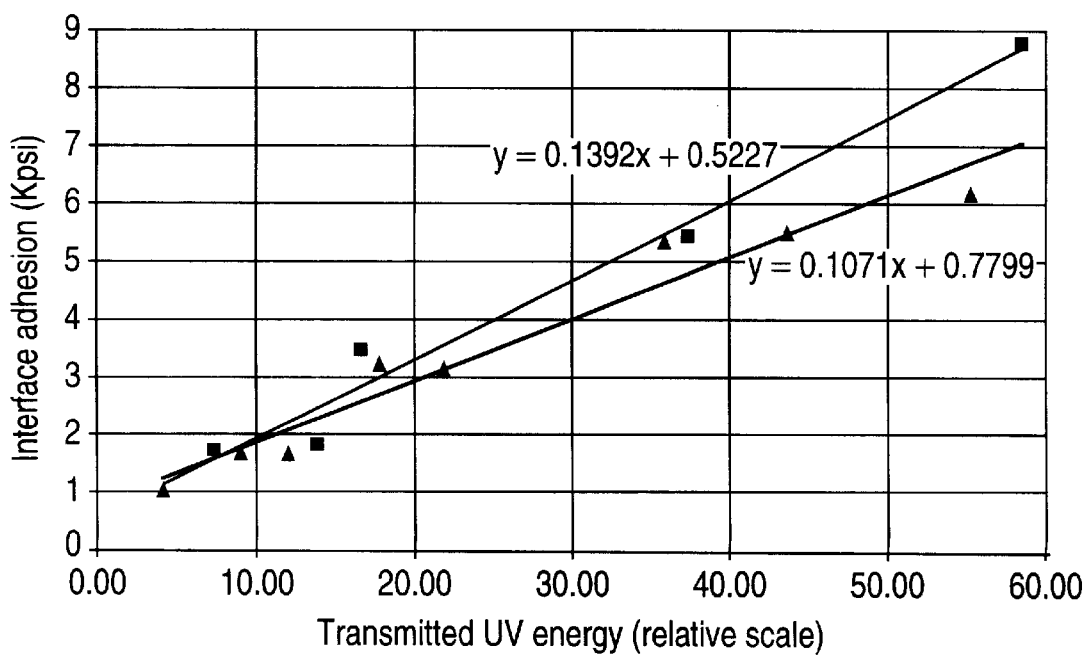
FIG. 4 is a graph displaying film-substrate interface adhesion (kpsi) versus transmitted ultraviolet energy for Parylene AF4 films.

Adhesion of the film to the surface was determined by a stud pull test as follows: Ten 0.5" by 0.5" pieces were cleaved from each of the coated wafers. Aluminum studs, kept at freezer temperature until 2 hours before use, were clipped to the center of each piece and baked on a hot plate at 150° C. for 65 minutes. The pieces were allowed to cool for 45 minutes before testing. A Sebastian Model 5 studpuller instrument was used to measure the adhesion strength of the polymer film. The end of the stud was clamped into the instrument and pulled upon until the system sensed a break. The value recorded is expressed in kpsi (thousand pounds per square inch). For each wafer, the mean of the values for the ten samples is plotted in FIG. 4. The transmitted UV energy at the interface between the Parylene film and the wafer substrate was calculated from the measured percentage of transmitted UV power versus film thickness given in FIG. 3 and the measured thickness of each sample. FIG. 4 displays adhesion versus transmitted ultraviolet energy for thirteen samples. FIG. 4 demonstrates that the adhesion of an organic polymer film to a silicon surface is linearly proportional to the transmitted UV energy at the interface between the polymer film and the silicon surface.

EXAMPLE 2

Layers of Parylene AF4 were deposited on bare silicon wafers in a CVD reactor according to the processes listed in Table 1, below, which also lists the thickness and adhesion of the resulting films. Layer thickness and adhesion were determined as in Example 1, above. In all cases, UV exposure was at 150 mW/cm$^2$ at wavelengths between 230 and 350 nm for the duration indicated. The anneal was at a temperature of 400° C. for 1 hour in a nitrogen atmosphere. For each example, the process was conducted as indicated by reading down the column, starting at the top. Procedures that were not applicable for a particular example are indicated by a dash. In example 2b, first approximately 1 $\mu$m of Parylene AF4 was deposited on a wafer. The coated wafer was then annealed and, finally, exposed to UV radiation for 600 seconds. Example 2a is the control case, in which there was no UV exposure.

TABLE 1

Process and Results for UV-Assisted Parylene Film Deposition

| Process | Example 2a | Example 2b | Example 2c | Example 2d | Example 2e | Example 2f | Example 2g |
| --- | --- | --- | --- | --- | --- | --- | --- |
| Approximate thickness AF4 layer ($\mu$m) | 1.0 | 1.0 | 1.0 | 0.15 | 0.15 | 0.15 | 0.45 |
| UV Exposure (sec) | — | — | 600 | 60 | 60 | 60 | 180 |
| Anneal | yes | yes | yes | — | — | — | — |
| Approximate thickness AF4 layer ($\mu$m) | — | — | — | 0.90 | 0.90 | 0.90 | 0.45 |
| UV Exposure (sec) | — | 600 | — | 60 | 180 | 360 | 180 |
| Anneal | — | — | — | yes | yes | yes | yes |
| Measured thickness ($\mu$m) | 0.95 | 0.84 | 0.88 | 0.90 | 0.90 | 0.96 | 0.76 |
| Adhesion (kpsi) | 0.3–0.5 | 1.73 | 3.16 | 1.16 | 1.40 | 2.97 | 1.41 |

Comparing Examples 2b–2g with the control case Example 2a, it will be understood that the processes of the present invention advantageously improve the adhesion of polymer films by exposure to ultraviolet radiation.

What is claimed is:

1. A process for depositing a polymer film on a semiconductor wafer comprising:

depositing a layer of a low dielectric constant polymer material on said wafer by chemical vapor deposition to form a coated wafer;

exposing said coated wafer to ultraviolet radiation; and heating said coated wafer, wherein the polymer film is annealed.

2. The process as in claim 1 wherein the low dielectric constant polymer material is a poly(p-xylylene) or a fluorinated poly(p-xylylene).

3. The process as in claim 2 wherein the low dielectric constant polymer material is Parylene AF4, Parylene N, Parylene C, or Parylene D.

4. The process as in claim 1 wherein the low dielectric constant polymer material is a material selected from the group consisting of Polynaphthalene-N, Polynaphthalene-F, and polytetrafluoroethylene.

5. A process for increasing the adhesion of a polymer film to a semiconductor wafer comprising:

depositing a film of a low dielectric constant polymer material on said wafer; and subsequently exposing said wafer to ultraviolet radiation, wherein the adhesion of said film to said semiconductor wafer is increased.

6. The process as in claim 5 wherein the low dielectric constant polymer material is poly(p-xylylene) or fluorinated poly(p-xylylene).

7. The process as in claim 6 wherein the low dielectric constant polymer material is Parylene AF4, Parylene N, Parylene C, or Parylene D.

8. The process as in claim 5 wherein the low dielectric constant polymer material is a material selected from the group consisting of Polynaphthalene-N, Polynaphthalene-F, polytetrafluoroethylene, polyimides, fluorinated polyimides, poly(arylene ethers), fluorinated poly(arylene ethers) benzocyclobutene, fluorinated benzocyclobutene, polycyclonorbornenes, hydrogen silsesquioxanes, organo silsesquioxanes, nanofoam polymers or aerogels, porous polyimides, and nanoporous silica aerogels.

9. A process for depositing a polymer film on a semiconductor wafer comprising exposing said wafer to ultraviolet radiation during chemical vapor deposition of said film.

10. The process as in claim 9 wherein the process for depositing a polymer film includes the process for depositing a film of a poly(p-xylylene) or a fluorinated poly(p-xylylene).

11. The process as in claim 10 wherein the process for depositing a film of a poly(p-xylylene) or a fluorinated poly(p-xylylene) is the process for depositing a film of Parylene AF4, Parylene N, Parylene C, or Parylene D.

12. The process as in claim 9 wherein the process for depositing a polymer film includes the process for depositing a film of a material selected from the group consisting of Polynaphthalene-N, Polynaphthalene-F, and polytetrafluoroethylene.

13. A process for depositing a polymer film on a surface of a semiconductor wafer, the process comprising:

exposing said surface to ultraviolet radiation; and depositing said polymer film on said exposed surface.

14. The process as in claim 13 wherein the process for depositing a polymer film comprises the process for depositing a film of a poly(p-xylylene) or a fluorinated poly(p-xylylene).

15. A process for depositing a polymer film on a semiconductor wafer, the process comprising:

depositing a layer of a low dielectric constant polymer material on said wafer to form a coated wafer; and exposing said coated wafer to ultraviolet radiation while heating said coated wafer, wherein said layer of polymer material is annealed.

16. The process as in claim 15 wherein the polymer film is a film of a poly(p-xylylene) or a fluorinated poly(p-xylylene).

17. A process for depositing a polymer film on a semiconductor wafer comprising:

depositing a first layer of a low dielectric constant polymer material on said wafer by chemical vapor deposition;

exposing said first layer to ultraviolet radiation;

depositing a second layer of said low dielectric constant polymer material on said first layer to form said polymer film; and heating said polymer film, wherein said polymer film is annealed.

18. The process of claim 17 further comprising exposing said polymer film to ultraviolet radiation before heating said polymer film.

19. The process of claim 17 wherein said low dielectric constant polymer material is a poly(p-xylylene) or a fluorinated poly(p-xylylene).

20. The process of claim 1 wherein exposing said coated wafer to ultraviolet radiation is exposing said coated wafer to ultraviolet radiation at an intensity of between 100 and 600 mW/cm$^2$.

21. The process of claim 5 wherein exposing said wafer to ultraviolet radiation is exposing said wafer to ultraviolet radiation at an intensity of between 100 and 600 mW/cm$^2$.

22. The process of claim 9 wherein exposing said wafer to ultraviolet radiation is exposing said wafer to ultraviolet radiation at an intensity of between 100 and 600 mW/cm$^2$.

23. The process of claim 15 wherein exposing said coated wafer to ultraviolet radiation is exposing said coated wafer to ultraviolet radiation at an intensity of between 100 and 600 mW/cm$^2$.

* * * * *